(12) United States Patent
Ohashi et al.

(10) Patent No.: US 7,062,849 B2
(45) Date of Patent: Jun. 20, 2006

(54) METHOD FOR PRODUCING CIRCUITRY USING MOLTEN METAL DROPLETS

(75) Inventors: Hitoshi Ohashi, Susono (JP); Hitoshi Ushijima, Susono (JP); Kinya Horibe, Susono (JP)

(73) Assignee: Yazaki Corporation, Tokyo (JP)

( * ) Notice: Subject to any disclaimer, the term of this patent is extended or adjusted under 35 U.S.C. 154(b) by 473 days.

(21) Appl. No.: 10/261,581

(22) Filed: Oct. 2, 2002

(65) Prior Publication Data

US 2003/0061710 A1 Apr. 3, 2003

(30) Foreign Application Priority Data

Oct. 3, 2001 (JP) .......................... P2001-307558

(51) Int. Cl.
*H01K 3/10* (2006.01)
(52) U.S. Cl. .............................. 29/852; 29/846; 29/825
(58) Field of Classification Search ................ 29/846, 29/852, 825
See application file for complete search history.

(56) References Cited

U.S. PATENT DOCUMENTS 4,891,242 A * 1/1990 Ito et al. ................... 427/98.5
5,454,161 A * 10/1995 Beilin et al. ................. 29/852
6,357,111 B1 * 3/2002 Uchiyama ................... 29/842

FOREIGN PATENT DOCUMENTS

| DE | 195 02 044 A1 | 7/1996 |
| EP | 0 637 057 A1 | 2/1995 |
| JP | 10-156524 | 6/1998 |
| JP | 10-195676 | 7/1998 |
| JP | 10-226803 | 8/1998 |
| JP | 2000-244086 | 9/2000 |
| WO | WO 97/25175 A1 | 7/1997 |

* cited by examiner

*Primary Examiner*—Richard Chang
(74) *Attorney, Agent, or Firm*—Sughrue Mion, PLLC

(57) ABSTRACT

A method for producing a circuitry includes steps of providing first coordinate data of at least one of positions, shapes and intervals of patterns of a first circuit, and jetting droplets of molten metal on a substrate so as to form the first circuit based on the coordinate data.

5 Claims, 6 Drawing Sheets

METHOD FOR PRODUCING CIRCUITRY USING MOLTEN METAL DROPLETS

BACKGROUND OF THE INVENTION

The present invention relates to a method and apparatus for producing a circuitry and particularly to a method and apparatus for producing a circuitry constituted by electric conductor circuits which is formed as patterns from bus bars, electric wires, etc. in electric junction box of a wiring system on a vehicle.

FIG. 8 shows an electric junction box which is proposed by the present Applicant as an example in which a circuitry constituted by electric conductor circuits is mounted. For example, the electric junction box 1 is provided for distributing and supplying a voltage from a power supply to on-vehicle electrical components through relays 2 and fuses 3. A body of the electric junction box has an upper cover 4, a wiring board 5, and a lower cover 6. The relays 2 and the fuses 3 are inserted in connection blocks 7 and 8 respectively so as to be held and received in the upper cover 4. Patterns of electric-power supply circuits are formed from bus bars 9 on the wiring board 5. A rear surface of the wiring board 5 is connected to pressure contact terminals so that patterns of electric-power supply circuits are formed from electric wires 10. In this manner, the patterns of electric conductor circuits are formed from the bus bars 9 and the electric wires 10 on the front and rear surfaces of the wiring board 5. The wiring board 5 is received in the lower cover 6 and further assembled with the upper cover 4 from above to thereby form the electric junction box 1.

The example of the circuitry is not limited to the case where the bus bars 9 and the electric wires 10 are used as shown in FIG. 8. Generally, in the case of bus bars 9, a sheet of copper foil is processed into circuit shapes by press-cutting or the like in accordance with the wiring direction and the current-carrying capacity. In the case of specifications of electric wires 10, diameters (small or large) are selected in accordance with the current-carrying capacity and the electric wires 10 are disposed along circuit patterns.

FIGS. 9, 10A and 10B typically show an example of the circuitry constituted by electric conductor circuits of only bus bars. That is, in this example, the electric conductor circuits constituted by a plurality of bus bars 12 to 16 different in width and length are formed as patterns on an insulation substrate 11. FIG. 10A is a sectional view taken along the line C—C in FIG. 9 and showing one bus bar 12. FIG. 10B is a sectional view taken along the line D—D in FIG. 9 and showing another bus bar 13 different in size from the bus bar 12.

The examples of the circuit bodies shown in FIGS. 8, 9, 10A and 10B have the following problems.

In the case of the circuitry shown in FIG. 8, electric wires with diameters of various specifications are used for forming patterns. Hence, there is a disadvantage in that the circuitry becomes heavy in weight. Moreover, it is necessary to fix terminals by some fixing method such as adhesion after electric wires cut into different sizes are disposed. In addition, the cost of production becomes high because the troublesome operation step of binding several electric wires 10 with a tape is required.

In the case of the circuitry shown in FIGS. 9, 10A and 10B, after bus bars 12 to 16 different in size and shape are formed from a sheet of copper foil by press cutting, the residual material of the copper foil is discarded as waste or subjected to a recycling process to attain reclamation. Hence, when a complex circuitry is formed as patterns from bus bars, it cannot be always said that the yield of material is good. In addition, like the case of the electric wires, it is necessary that the bus bars 12 to 16 obtained thus as materials are fixed onto the insulation substrate 11 by a fixing method such as adhesion. Hence, this is also a cause of increase in cost.

Particularly in vehicles and various kinds of electric/electronic apparatuses severely limited in reduction of weight and wiring space, FPCs (flexible printed circuit boards) and FFCs (flexible flat circuit boards) capable of being applied flexibly thereto is used popularly to solve the problems in such a circuitry using bus bars or electric wires as described above. In recent years, however, the arrangement space and wiring space is limited more severely with the increase in the number of functions and the increase in the number of circuits caused by increase in the number of peripheral apparatuses. That is, in the existing environment, it has become impossible to use even the FPCs and FFCs as wiring circuits and wiring boards. Moreover, in each of the FPCs and FFCs, electric conductor wiring needs to be covered with an insulation film to form an insulation structure. In addition, it is uneconomical to use the FPCs and FFCs because redundant portions are removed by fusion or another method.

As described above, the circuit bodies using bus bars, electric wires, FPCs and FFCs have the problems respectively. In recent years, in place of those circuit bodies, a method of flame spraying a metal rod or metal powder by plasma or arc while spraying nitrogen gas or the like to thereby spray molten metal onto a target position has begun to be used. In the method of spraying molten metal, a process such as masking sealing is required for spray-depositing molten metal on the target position accurately. Hence, there is a disadvantage in that the cost for processing material becomes correspondingly high. In addition, a large amount of molten metal is diffused into a wide range, so that there arises a problem that it is uneconomical to use the method because the material is wasteful.

SUMMARY OF THE INVENTION

Therefore, an object of the invention is to provide a method and apparatus for producing a circuitry, in which reduction In wiring space and weight particularly severely limited in vehicles and electronic/electric apparatuses can be achieved and in which reduction in cost for processing material can be achieved.

In order to achieve the above object, according to the present invention, there is provided a method of producing a circuitry, comprising the steps of:

providing first coordinate data of at least one of positions, shapes and intervals of patterns of a first circuit; and jetting droplets of molten metal on a substrate so as to form the first circuit based on the coordinate data.

In this method, the circuitry is formed from the circuits on the basis of coordinate data. Hence, unlike the related bus bars, the wastefulness of the residual material taken from a sheet of copper foil can be eliminated to improve the yield of material. With respect to reduction in cost for processing material, this method is very economical compared with the related method in which a circuitry is formed from electric conductor circuits by using electric wires, FPCs, FFCs, etc. or by flame spraying molten metal. Moreover, because the droplets of molten metal are lap-jointed to form circuits, each of the circuits can be formed locally from a required minimum amount of the molten metal on the substrate in accordance with the material of the substrate even in the case where the substrate is disposed in a narrow place due to the location condition of the apparatus in which the substrate is disposed. Hence, the degree of freedom for wiring is improved more greatly than that in use of the bus bars, the electric wires, the FPCs, the FFCs, etc.

Preferably, the method further comprising the stop of covering the substrate with an insulator before the step of the jetting droplets of the molten metal, when the substrate is comprised of a conductive material.

In this method, a circuitry can be formed freely from molten metal supplied in accordance with the material of the substrate on which the circuitry is provided.

Preferably, the method further comprising the steps of:
jetting the droplets of the molten metal on the first circuit so as to form a joint portion;
forming an insulation layer on the first circuit so that the joint portion is surrounded with the insulation layer;
providing second coordinate data of at least one of positions, shapes and intervals of patterns of a second circuit; and
jetting the droplets of the molten metal on the insulation layer so as to form the second circuit so that the first circuit and the second circuit are electrically connected via the joint portion based on the second coordinate data.

In this method, when a laminated circuitry constituted by two or more layers needs to be formed, the molten metal is piled up so as to electrically connect the first circuit and the second circuit to each other. Hence, any through-hole deliberately provided in the related circuit board need not be provided. A laminated circuitry greatly excellent in process yield can be formed efficiently.

Preferably, the jetting step is jetting the droplets of the molten metal to a target position on the substrate while expanding and contracting a piezoelectric element so as to press the molten metal via a diaphragm.

Preferably, the jetting step is jetting the drops of the molten metal by gas fluid pressure while melting a leading end of a wire by electric discharge so as to form the drops of molten metal.

Preferably, the jetting step is jetting the molten metal while melting ejected metal powder by a high-output laser.

In the methods, a required minimum amount of molten metal can be supplied to a target position between circuits without necessity of any special processes such as masking and etching.

According to the present invention, there is also provided an apparatus for producing a circuitry, comprising:
a table, retaining a substrate;
a molten metal supplier, jetting droplets of molten metal on the substrate so as to form a circuit based on coordinate data of at least one of positions, shapes and intervals of patterns of the circuit; and
a controller, controlling a movement of the table and the molten metal supplier based on the coordinate data.

In this configuration, when, for example, the substrate is an insulation substrate, the insulation substrate is positioned and retained on the table. The controller stores at least two-dimensional coordinate data concerning positions, shapes and interval of patterns of the circuits of the circuitry formed on the insulation substrate. The molten metal supplier has a molten metal supply source, a nozzle actuator, and a jet nozzle. When the insulation substrate is positioned and retained on the table, the molten metal supplier and the table are moved by an operating program based on the coordinate data in accordance with a control signal given from the controller. For example, the jet nozzle is moved by the nozzle actuator of the molten metal supplier, and then, molten metal is jetted and supplied from the jet nozzle onto the insulation substrate on the table. As a result, the circuitry constituted by the circuits can be formed efficiently without waste.

Preferably, the molten metal supplier includes a piezoelectric element which presses the molten metal via a diaphragm; and wherein the molten metal supplier jets the droplets of the molten metal to a target position on the substrate.

Preferably, the molten metal supplier includes an electric discharger which melts a leading end of a wire so as to form the drops of molten metal, and includes a gas fluid pressure generator which jets the drops of the molten metal by gas fluid pressure.

Preferably, the molten metal supplier includes a laser beam unit which melts ejected metal powder by a high-output laser, and the molten metal supplier supplies the molten metal.

In the configurations, a required minimum amount of molten metal can be supplied to a target position between electric conductor circuits without necessity of any special processes such as masking and etching.

Preferably, the molten metal supplier includes a jet nozzle which adjusts a droplet diameter and jetting speed of the droplets of the molten metal.

In this configuration, in the case of an apparatus in which molten metal can be jetted and supplied only to a target position without necessity of masking, the nozzle outlet diameter and jetting speed of the jet nozzle are adjusted. As a result, molten metal droplets with droplet diameter and speed selected in accordance with to the interval or pitch fine or relatively wide and large between circuits can be jetted so that a circuitry can be efficiently formed from a required minimum amount of molten metal.

Preferably, the controller controls at least one of a jetting timing, jetting interval and a total amount of the droplets of the molten metal jetted by the molten metal supplier.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

An embodiment of a method and apparatus for producing a circuitry according to the invention will be described below in detail with reference to the drawings.

Figure 1:
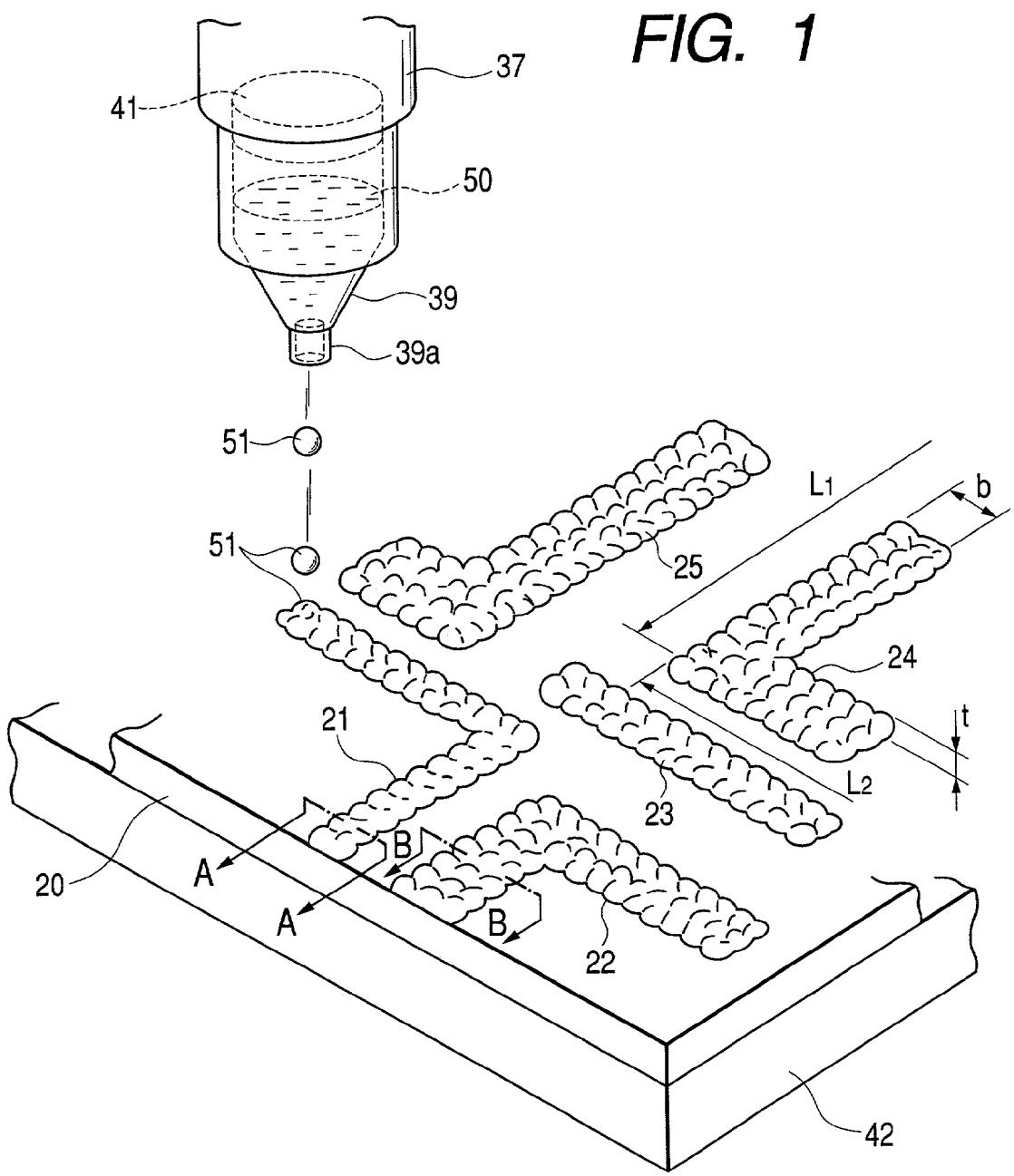
FIG. 1 is a perspective view showing an embodiment of a method for producing a circuitry according to the invention.
Figure 2A:
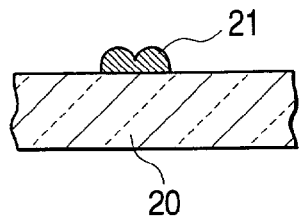
FIG. 2A is a sectional view taken along the line A—A in FIG. 1.
Figure 2B:
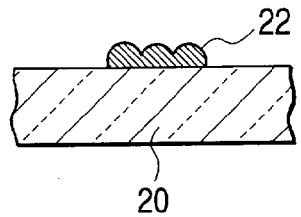
FIG. 2B is a sectional view taken along the line B—B in FIG. 1.

FIGS. 1, 2A and 2B show a method for producing a circuitry formed from electric conductor circuits 21 to 25 by depositing molten metal along circuit patterns on an insulation substrate 20 which is an example of the substrate used in the invention. The substrate is not limited to the insulation substrate 20. For example, a surface of a narrow member in a vehicle, an electronic/electrical apparatus or the like can be extensively regarded as the substrate. The method is intended for general structures of materials for the manufacturing of machinery and surfaces thereof.

Figure 3:
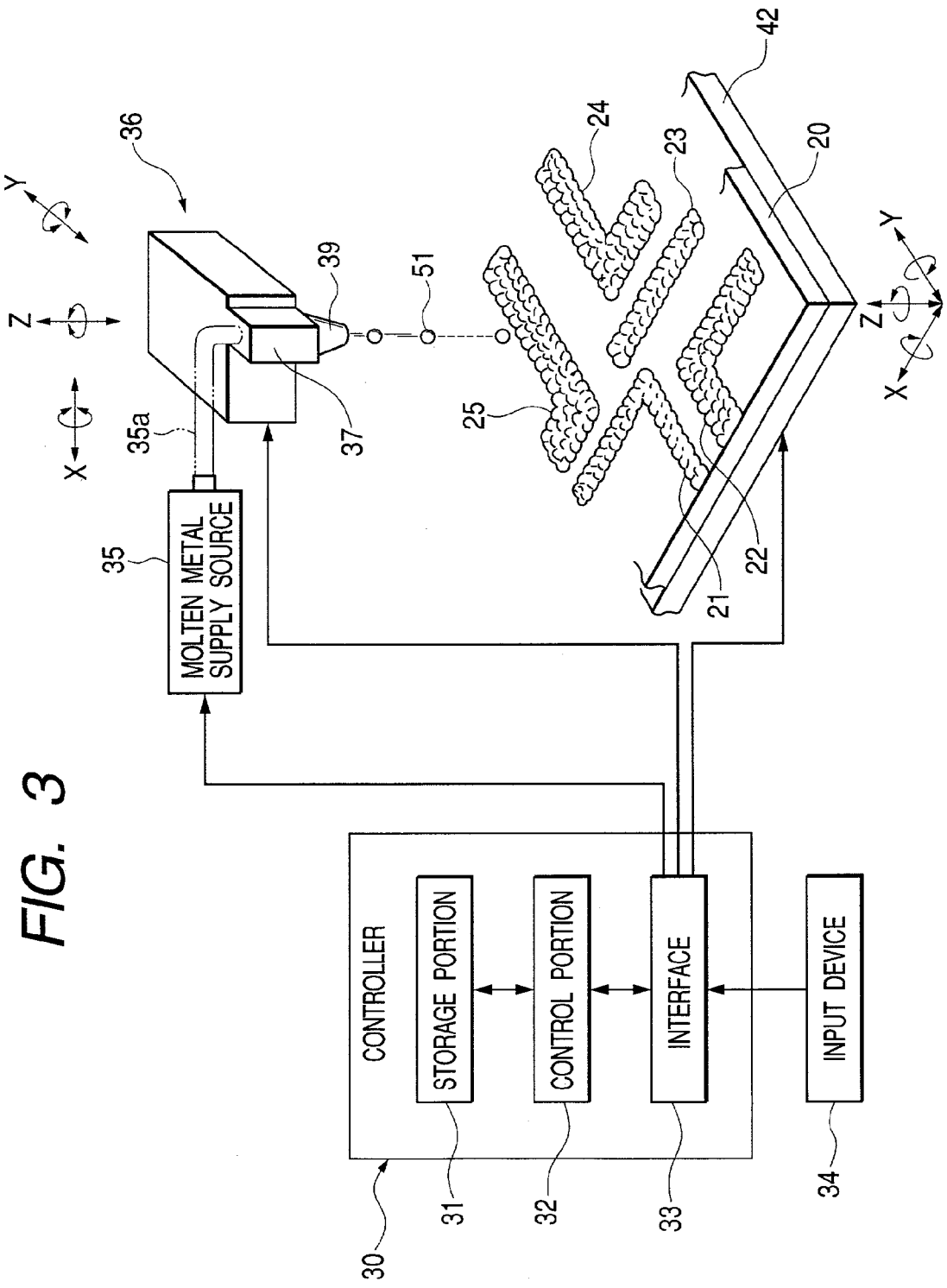
FIG. 3 is a systematic configuration diagram showing an embodiment of an apparatus for producing a circuitry according to the invention.

The insulation substrate 20 is used as a work which is positioned and set on a work retaining table 42 in a circuitry producing apparatus shown in FIG. 3. Conductive molten metal in the form of droplets is jetted from a jet nozzle 39 toward target positions on the insulation substrate 20 and fusion-bonded to the target positions successively along circuit patterns set on the insulation substrate 20 to thereby form electric conductor circuits.

A controller 30 stores planar two-dimensional coordinate data and solid three-dimensional coordinate data indicating positions, shapes and inter-circuit pitches of the electric conductor circuits 21 to 25 formed as patterns on the insulation substrate 20. As shown in FIG. 1, for example, in the electric conductor circuit 24, the size and shape constituted by position on the insulation substrate 20, length $L_1$, width b, bending direction, length $L_2$ in the bending direction, circuit thickness t, etc. are stored as coordinate data, Metal droplets 51 of molten metal 50 are jetted from the jet nozzle 39 along the circuit pattern based on the coordinate data so that a necessary amount of the molten metal 50 neither too much nor too little is dropped perpendicularly toward each of the target positions on the insulation substrate 20 and fusion-bonded to the target position. In this manner, the metal droplets 51 are lap-jointed, so that the electric conductor circuits 21 to 25 with required sizes and shapes are formed successively on the basis of a forming program.

The material of the molten metal 50 used in the form of droplets is not particularly limited. For example, solder, which is an eutectic alloy containing 60% of Pb, and 40% of Sn, may be used or a conductive material such as aluminum (Al), copper (Cu), silver (Ag), or gold (Au) may be used. Aluminum is particularly effective in reduction of weight. Copper is effective in suppression of the influence of electrical resistance because copper is low in electrical conductivity and generally the same as the material of an electric conductor circuit used popularly as a general circuit. Silver or gold is high in electrical conductivity and has an advantage in that it is excellent in fluidity, etc.

Figure 4:
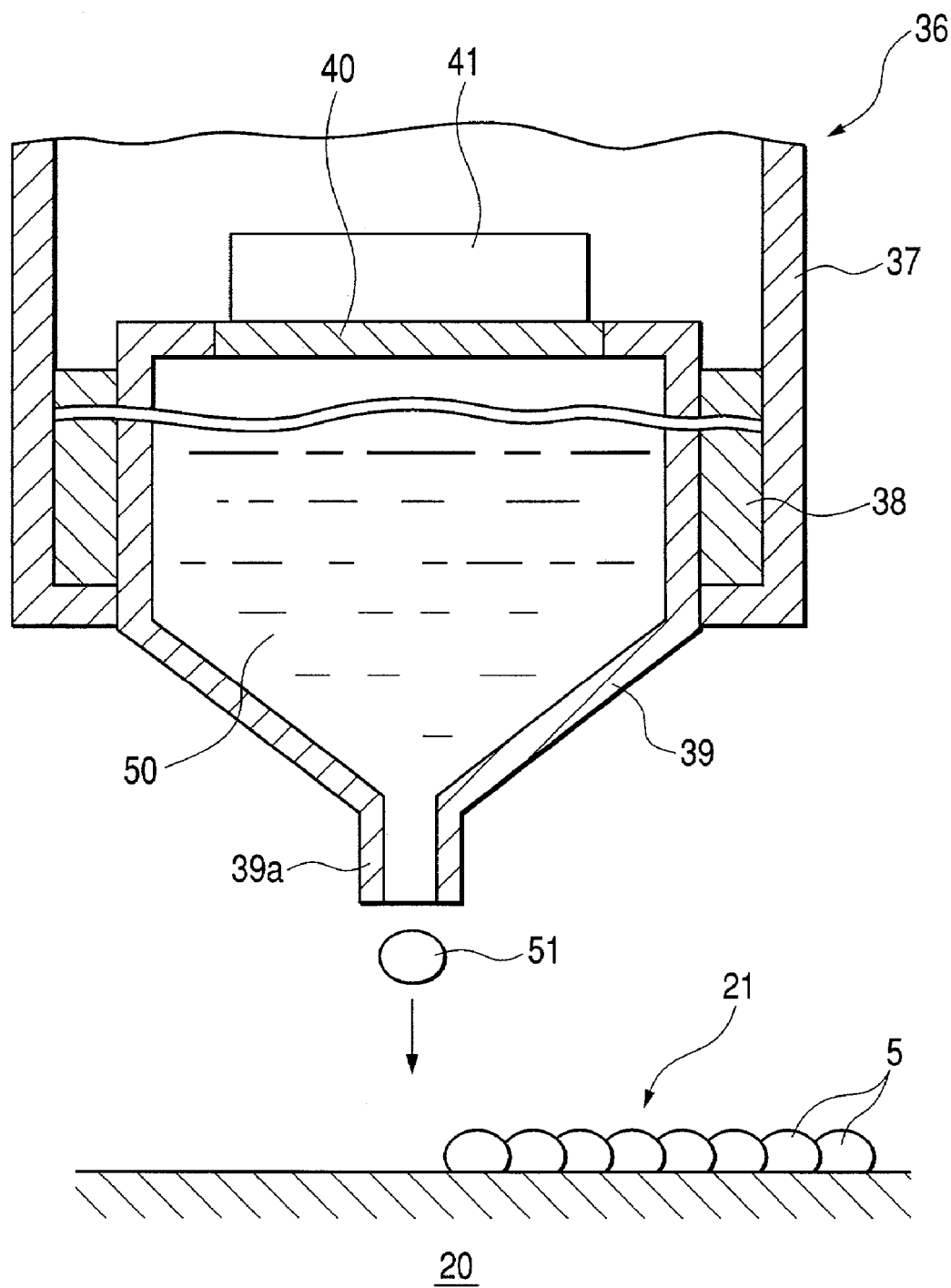
FIG. 4 is a sectional view showing a jet nozzle as important part of the apparatus.

FIG. 3 shows a system for forming circuit patterns of the electric conductor circuits 21 to 25 on the insulation substrate 20. FIG. 4 is a sectional view of important part of the system. The system has a controller 30 constituted by a micro-computer, a data input device 34 as an external device, a molten metal supply source 35, a nozzle actuator 36 provided with a jet nozzle 39, and a work retaining table 42. Incidentally, the concept "molten metal supply unit" used in the invention means a set of devices including the molten metal supply source 35 and the nozzle actuator 36.

The controller 30 has a storage portion 31 constituted by ROM and RAM, a control portion 32 cooperating with an arithmetic operation portion to form a CPU, and an interface 33 provided with an I/O port. The operations of the molten metal supply source 35, the nozzle actuator 36 and the work retaining table 42 are controlled on the basis of control signals output from the I/O port of the interface 33.

The storage portion 31 stores CAD data obtained by mechanically designing circuit patterns constituted by the electric conductor circuits 21 to 25 formed on the insulation substrate 20 as a two-dimensional or three-dimensional model, and processing the circuit patterns by a computer. That is, information concerning positions, dimensional shapes such as widths and lengths, sectional areas, etc. of the electric conductor circuits 21 to 25 is stored as coordinate data in a coordinate system capable of indicating the size of the insulation substrate 20 as a whole.

The control portion 32 sends various kinds of control signals and operating signals through the I/O port of the interface 33 and receives information from the input device 34 which is an external device. The following control is performed on the basis of the output signals from the control portion 32. The amount of jetted molten metal supplied from the molten metal supply source 35 is controlled. Further, the molten metal supply source 35 is controlled to be operated to thereby supply the molten metal 50 to the nozzle actuator 36. Further, operating control is performed for shaping the supplied molten metal 50 into the metal droplets 51. Further, operating control is performed for jetting the metal droplets 51 from the jet nozzle 39. Further, operating control is performed for moving the jet nozzle 39 relatively to the work retaining table 42 in two-dimensional or three-dimensional directions represented by the arrows X, Y and Z on the coordinate axes.

FIG. 4 is a sectional view showing the internal structure of the nozzle actuator 36. In the inside of a housing 37 of the apparatus body, the jet nozzle 39 shaped like a tube tapered off downward is received as an interchangeable cartridge. The molten metal 50 from the molten metal supply source 35 is supplied to the cartridge type jet nozzle 39 through a supply pipe 35a (see FIG. 3). The lower end of the tube of the jet nozzle 39 in FIG. 4 forms an orifice-shaped nozzle outlet 39a. The jet nozzle 39 has an opening portion at the upper base end of the tube. A diaphragm 40 is mounted to block the opening portion of the jet nozzle 39. A piezoelectric element 41 is disposed on the outside of the diaphragm 40 so as to make close contact with the diaphragm 40. The diaphragm 40 and the piezoelectric element 41 form a piezoelectric transducer as an oscillator. The piezoelectric element 41 may be replaced by inert gas such as nitrogen.

Hence, the nozzle actuator 36 is operated on the basis of an actuating signal output from the controller 30, so that the oscillation frequency of the piezoelectric transducer is resonated to vibrate the diaphragm 40 to thereby transmit the vibration of the diaphragm 40 to the molten metal 50. The molten metal 50 is shaped into metal droplets 51 by vibration. The metal droplets 51 shaped thus are jetted from the nozzle outlet 39a quantitatively and regularly at appropriate time intervals programmed in advance, so that the metal droplets 51 are fusion-bonded onto the insulation substrate 20 to thereby form circuit patterns of the electric conductor circuits 21 to 25. A heater 38 is mounted on the coaxial outside of the tube-like jet nozzle 39 so that the molten metal 50 in the jet nozzle 39 can be kept at a required temperature.

The technique for fusion-bonding the molten metal droplets is disclosed in the three-dimensional structure producing method described in JP-A-10-156524, JP-A-10-195676 and JP-A-10-226803. A semiconductor producing apparatus for producing solder bumps on a semiconductor wafer chip by jetting a conductive material such as solder in the form of molten material droplets is also disclosed in "Metal Jet System (product name)" made by MPM Corp. in the U.S., as introduced by JP-A-2000-244086.

In FIG. 3, the work retaining table 42 can move on the two-dimensional or three-dimensional coordinate axes represented by the arrows X, Y and Z while the insulation substrate 20 as an operating work is positioned and retained on the work retaining table 42. The work retaining table 42 moves relatively to the nozzle actuator 36 on the two-dimensional or three-dimensional coordinate axes X, Y and Z. In this embodiment, the nozzle actuator 36 moves relatively to the work retaining table 42, so that the nozzle actuator 36 acts on the insulation substrate 20 positioned on the table, on the basis of a coordinate system moving program.

That is, the nozzle actuator 36 moves on the coordinate axes in accordance with an actuating instruction given from the control portion 32. The piezoelectric transducer supplied with electric power vibrates the metal droplets 51. The metal droplets 51 jetted from the jet nozzle 39 are fusion-bonded along presumptive circuit patterns on the insulation substrate 20 positioned and retained on the work retaining table 42. In this manner, the electric conductor circuits 21 to 25 are accurately formed from required minimum amounts of the metal droplets 51 in predetermined positions successively at time intervals so that the electric conductor circuits 21 to 25 have predetermined sizes and shapes respectively. Control concerning the formation of such circuit patterns is performed by the control portion 32. The nozzle actuator 36 and the jet nozzle 39 are operated on the basis of control of the control portion 32.

Although this embodiment has shown the case where the piezoelectric element 41 constituting a piezoelectric transducer is used as a device for vibrating the molten metal 50, the invention is not limited thereto. For example, as described above, there may be used a unit for compressively supplying inert gas such as nitrogen gas to feed a pulse-like gas pressure to the molten metal 50 to thereby vibrate the molten metal 50 or a device for mechanically vibrating a diaphragm such as a tuning fork to transmit the amplitude of the vibration to the molten metal 50.

Although this embodiment has shown the case where the metal droplet jet type device is used as the nozzle actuator 36, any other device may be used as the nozzle actuator 36 if a required minimum amount of the molten metal can be jetted and supplied locally. For example, there may be used a device for supplying molten metal droplets at a gas fluid pressure by melting a forward end of a wire into drops by electric discharge or a device for melting ejected metal powder by a high-output laser to thereby supply molten metal droplets.

In the case of the metal droplet jet type nozzle actuator 36, molten metal droplets with droplet diameter and speed selected in accordance with the distance and pitch fine or relatively wide and large between electric conductor circuits can be formed by adjustment of the nozzle outlet diameter and jetting speed of the jet nozzle 39.

Further, the controller 30 controls a jetting timing, jetting interval and a total amount of the droplets of the molten metal jetted from the jet nozzle 39.

Figure 5:
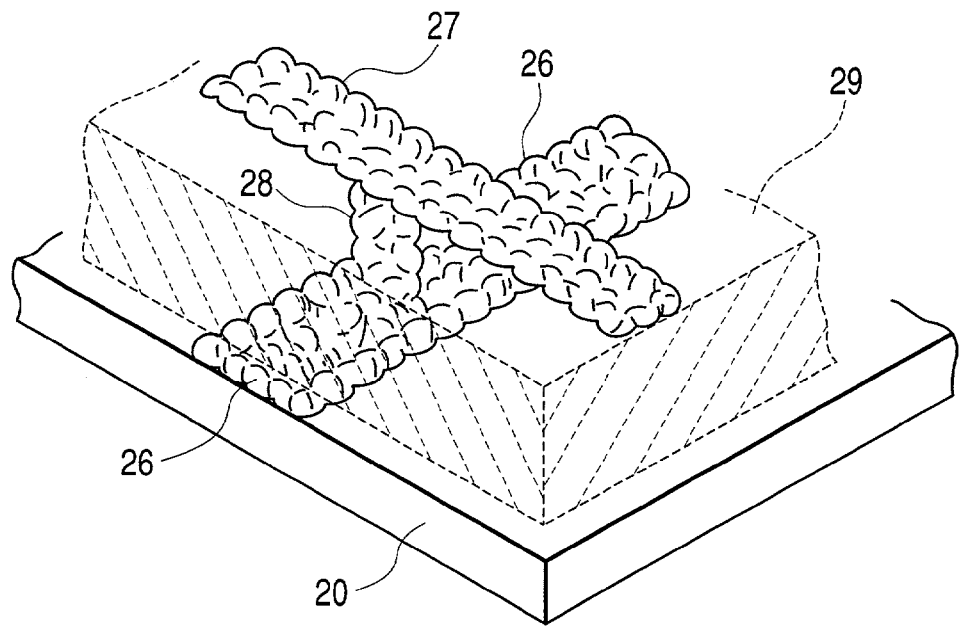
FIG. 5 is a perspective view showing a laminated circuitry produced by the producing method according to a second embodiment of the invention.
Figure 6:
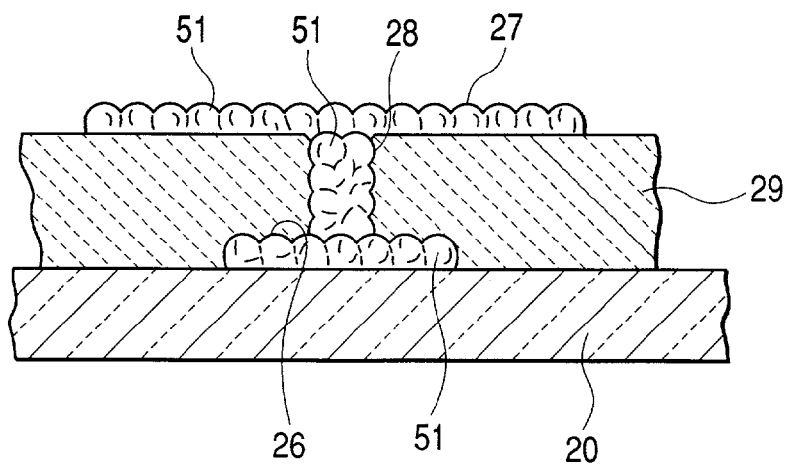
FIG. 6 is a sectional view showing the laminated circuitry according to the second embodiment.
Figure 7:
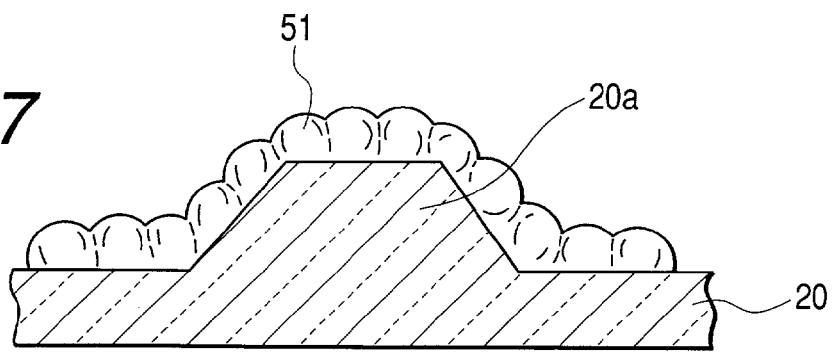
FIG. 7 is a perspective view showing a solid circuitry produced by the producing method according to a third embodiment of the invention.
Figure 8:
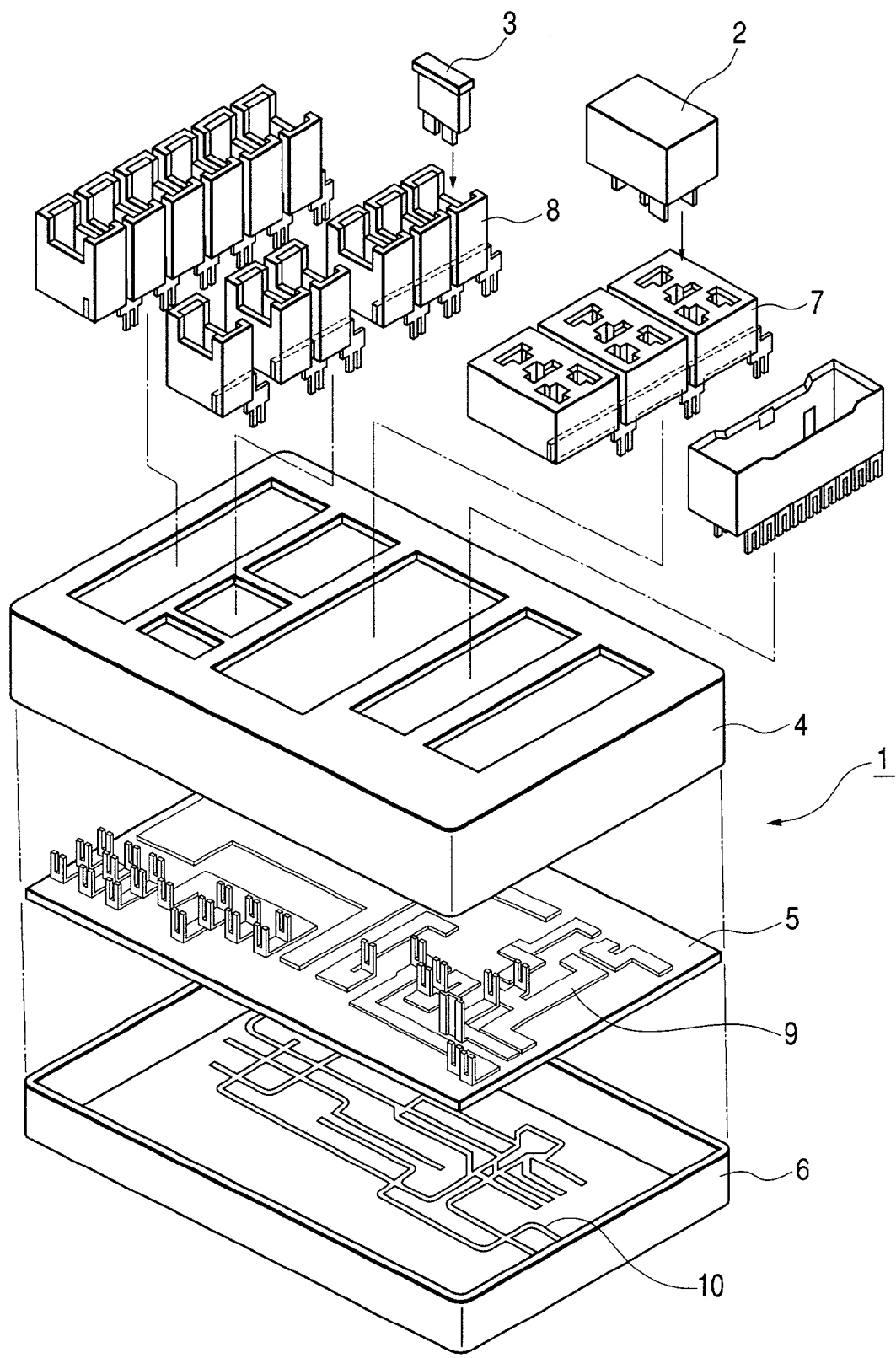
FIG. 8 is an exploded perspective view showing an electric junction box of a vehicles wiring system as an example in which the circuitry constituted by electric conductor circuits is mounted.
Figure 9:
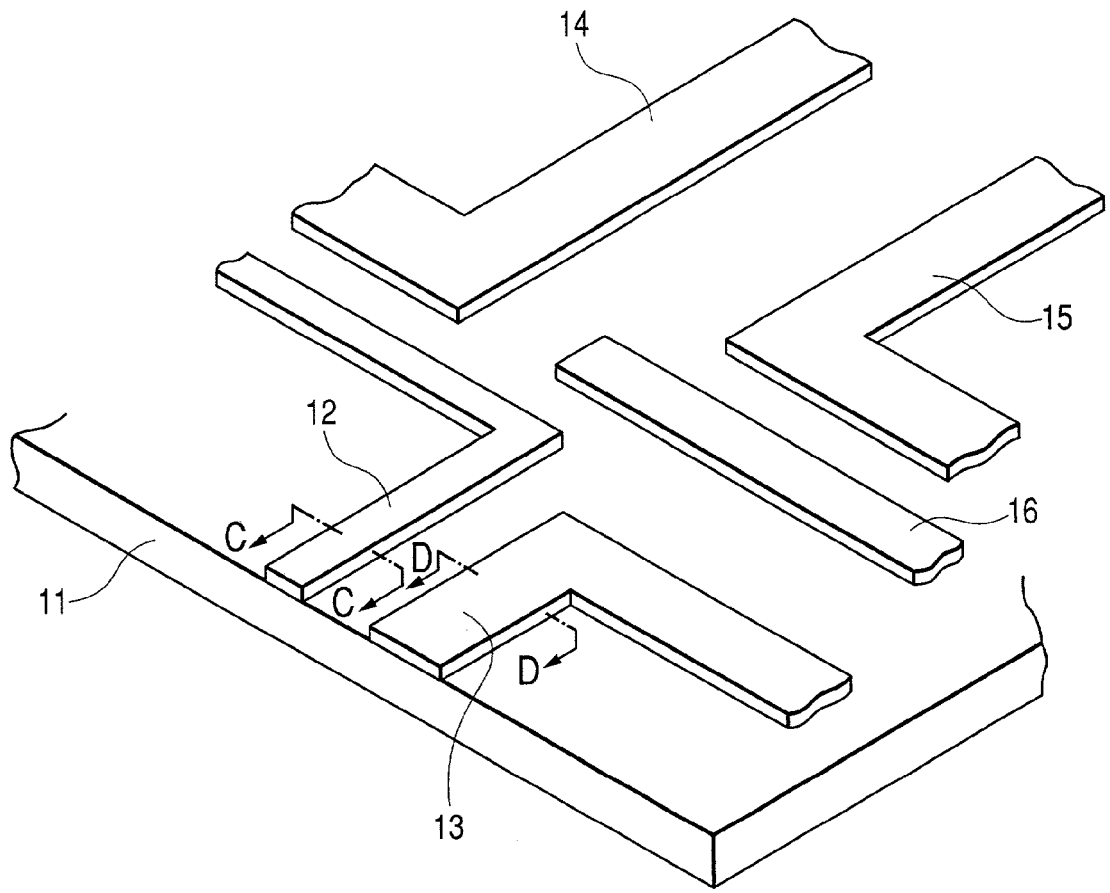
FIG. 9 is a perspective view showing a related-art circuitry constituted by bus bars.
Figure 10A:
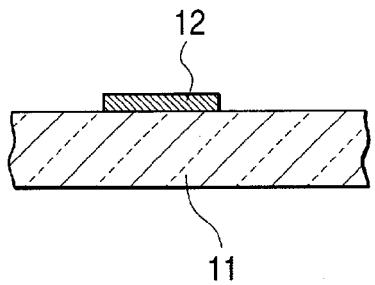
FIG. 10A is a sectional view taken along the line C—C in FIG. 9.
Figure 10B:
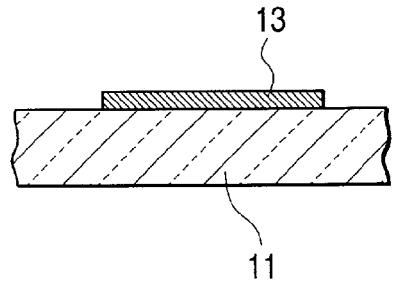
FIG. 10B is a sectional view taken along the line D—D in FIG. 9.

On the other hand, the method for producing a circuitry according to the invention is not limited to the formation of two-dimensional planar one-layer circuit patterns of the electric conductor circuits 21 to 25 shown in FIG. 1. Patterns can be formed very efficiently without waste in a second embodiment in which a laminated circuitry constituted by two, upper and lower layers is formed as shown in FIGS. 5 and 6 or in a third embodiment in which a solid circuitry is formed as shown in FIG. 7.

First, the laminated circuitry shown in FIGS. 5 and 6 according to the second embodiment is formed as follows. When the substrate as a base for forming the laminated circuitry is an insulator such as the insulation substrate 20, a first-layer electric conductor circuit 26 is formed from the metal droplets 51 along a designated circuit pattern on the insulation substrate 20 Then, the metal droplets 51 are jetted in a direction perpendicular to a designated portion of the first-layer electric conductor circuit 26 so that the metal droplets 51 are piled up to thereby form a pillar-like joint portion 28 with a predetermined height. Then, an insulation layer 29 is formed on the first-layer electric conductor circuit 26 so that the joint portion 28 is buried in the insulation layer 29, that is, the first-layer electric conductor circuit 26 is covered with the insulation layer 29. The material of the insulation layer 29 is not particularly limited here A second-layer electric conductor circuit 27 is formed on the insulation layer 29. As a result, the first-layer electric conductor circuit 26 and the second-layer electric conductor circuit 27 are electrically connected to each other by the pillar-like joint portion 28. In this manner, a laminated circuitry constituted by two, upper and lower layers or by three or more layers is formed.

As described above, in the laminated circuitry according to the second embodiment, the first-layer and second-layer electric conductor circuits 26 and 27 are electrically connected to each other by the joint portion 28 formed by piling up the molten metal droplets. Hence, the related-art steps of: deliberately forming a through-hole in a circuit substrate; and pouring a conductive material into the through-hole to electrically connect layers to each other can be omitted.

The solid circuitry shown in FIG. 7 according to the third embodiment is formed as follows. When the substrate as a base for forming the solid circuitry is an insulator such as the insulation substrate 20 or another material for the manufacturing of machinery in the condition that a protrusion 20a is partially provided on a surface of the insulation substrate 20 or the material for the machinery, the solid circuitry can be formed efficiently by jetting the metal droplets 51 one by one along the surface of the protrusion 20a.

Although the present invention is shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims

What is claimed is:

1. A method for producing a circuitry, comprising the steps of:

providing first coordinate data of at least one of positions, shapes and intervals of patterns of a first circuit; and jetting droplets of molten metal on a substrate so as to form the first circuit based on the coordinate data and further comprising the steps of:

jetting the droplets of the molten metal on the first circuit so as to form a joint portion:

forming an insulation layer on the first circuit so that the joint portion is surrounded with the insulation layer;

providing second coordinate data of at least one of positions, shapes and intervals of patterns of a second circuit; and jetting the droplets of the molten metal on the insulation layer so as to form the second circuit so that the first circuit and the second circuit are electrically connected via the joint portion based on the second coordinate data.

2. The method as set forth in claim 1, further comprising the step of covering the substrate with an insulator before the step of the jetting droplets of the molten metal, when the substrate is comprised of a conductive material.

3. The method as set forth in claim 1, wherein the jetting step is jetting the droplets of the molten metal to a target position on the substrate while expanding and contracting a piezoelectric element so as to press the molten metal via a diaphragm.

4. The method as set forth in claim 1, wherein the jetting step is jetting the drops of the molten metal by gas fluid pressure while melting a leading end of a wire by electric discharge so as to form the drops of molten metal.

5. The method as set forth in claim 1, wherein the jetting step is jetting the molten metal while melting ejected metal powder by a high-output laser.

* * * * *